(12) United States Patent
Shin et al.

(10) Patent No.: US 9,024,702 B2
(45) Date of Patent: May 5, 2015

(54) LOW PHASE SHIFT VOLTAGE VARIABLE ATTENUATOR

(71) Applicant: Electronics and Telecommunications Research Institute, Daejeon (KR)

(72) Inventors: Dong Hwan Shin, Daejeon (KR); Seong Mo Moon, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 190 days.

(21) Appl. No.: 13/895,498

(22) Filed: May 16, 2013

(65) Prior Publication Data
US 2014/0152395 A1 Jun. 5, 2014

(30) Foreign Application Priority Data
Dec. 3, 2012 (KR) .................. 10-2012-0138860

(51) Int. Cl.
*H01P 1/22* (2006.01)
*H03H 7/25* (2006.01)
*H03H 11/24* (2006.01)

(52) U.S. Cl.
CPC .............. *H03H 11/245* (2013.01); *H03H 7/25* (2013.01)

(58) Field of Classification Search
USPC ............. 333/81 R, 81 A, 17.2, 109, 110, 111, 333/112, 117, 118, 138, 139
See application file for complete search history.

(56) References Cited

U.S. PATENT DOCUMENTS

| | | | |
|---|---|---|---|
| 4,823,096 A * | 4/1989 | Hash | 333/109 |
| 5,392,009 A * | 2/1995 | Talwar | 333/81 R |
| 2002/0084867 A1 | 7/2002 | Watanabe | |
| 2012/0075017 A1 | 3/2012 | Gao | |

FOREIGN PATENT DOCUMENTS

JP 2012-129721 7/2012

* cited by examiner

*Primary Examiner* — Stephen E Jones
(74) *Attorney, Agent, or Firm* — Nelson Mullins Riley & Scarborough LLP; Anthony A. Laurentano, Esq.

(57) ABSTRACT

Disclosed is a low phase shift voltage variable attenuator. The low phase shift voltage variable attenuator may include: a first directional coupler including a first input terminal in which a signal is input, a first isolation terminal connected to a ground power source through a termination resistor, a first coupling terminal, and a first through terminal; a second directional coupler including a second input terminal through which an attenuated signal, which is the attenuated input input signal, is output, a second isolation terminal connected to a ground power source through a termination resistor, a second coupling terminal, and a second through terminal; and a signal attenuating unit connected to the first coupling terminal, the first through terminal, the second coupling terminal, and the second through terminal, and configured to attenuate a signal transmitted through the first directional coupler to transmit the attenuated signal to the second directional coupler.

11 Claims, 8 Drawing Sheets

LOW PHASE SHIFT VOLTAGE VARIABLE ATTENUATOR

CROSS-REFERENCE TO RELATED APPLICATIONS

This application claims priority to and the benefit of Korean Patent Application No. 10-2012-0138860 filed in the Korean Intellectual Property Office on Dec. 3, 2012, the entire contents of which are incorporated herein by reference.

TECHNICAL FIELD

The present invention relates to an attenuator used for changing a magnitude of a signal in a microwave band, and more particularly, to a low phase shift voltage variable attenuator capable of minimizing a phase variation of an output signal and input/output return loss according to an attenuation value variable according to a control voltage.

BACKGROUND ART

An attenuator may adjust a magnitude of a signal by reducing the magnitude of the signal, and an analog-type attenuator, such as a voltage variable attenuator, may continuously attenuate a magnitude of a signal according to a value of an adjustment voltage. The attenuator is widely used in various electronic systems, and especially, in a case of a system which needs to very accurately adjust a magnitude of a signal, such as a phased array antenna, a radar system, or a multi-port amplifier, the attenuator needs to have excellent performance. These systems need to simultaneously adjust a phase, as well as a magnitude of a signal. When a variation in an output phase is large when an attenuation value of the attenuator is adjusted, a false operation may be caused in the system. The attenuator and other components, for example, a phase shifter, connected to the attenuator need to have a very excellent return loss characteristic in order to minimize mutual influence when a magnitude of a signal and a phase are adjusted.

FIGS. 1A to 1C are attenuator structures in the related art, and FIG. 1A is an attenuator 110 having a PI structure, FIG. 1B is an attenuator 120 having a T structure, and FIG. 1C is an attenuator 130 having a transmission or distributed structure. A varactor diode, a PIN diode, a FET element, and the like are variously used as a voltage variable resistor element used for manufacturing the attenuator, and MMIC attenuators using the aforementioned elements have been recently much manufactured according to development of a semiconductor technology. The attenuator having the PI or T structure of FIG. 1A or 1B is an example of a circuit using a FET element, and is easily manufactured with a simple structure and exhibits regular attenuation performance in a broadband, but attenuation performance, return loss, and insertion loss performance thereof deteriorate according to influence of parasitic components of the element as a used frequency band is increased. The transmission structure of FIG. 1C exhibits excellent performance in a relatively higher frequency band than the structures of FIGS. 1A and 1B, but it is difficult to achieve very excellent return loss performance.

A phase variation is generated in the aforementioned voltage variable attenuators of FIGS. 1A to 1C when an attenuation operation is performed, and especially, influence of the parasitic components are further increased in a high operation frequency, so that a phase variation is further increased. That is, in a system which needs to accurately adjust the magnitude of a signal, it is necessary to minimize the phase shift and the change in return loss during the operation of the attenuator. However, the aforementioned attenuator in the related art has a problem in that a relatively larger phase variation is generated, and the return loss is considerably changed according to attenuation. The variable attenuator in the related art is disclosed in Korean Patent Application Publication No. 2006-0044082, and the like.

SUMMARY OF THE INVENTION

The present invention has been made in an effort to provide a low phase shift voltage variable attenuator capable of minimizing a phase variation of an output signal and input/output return loss.

An exemplary embodiment of the present invention provides a low phase shift voltage variable attenuator, including: a first directional coupler including a first input terminal in which a signal is input, a first isolation terminal connected to a ground power source through a termination resistor, a first coupling terminal, and a first through terminal; a second directional coupler including a second input terminal through which an attenuated signal, which is the attenuated input input signal, is output, a second isolation terminal connected to a ground power source through a termination resistor, a second coupling terminal, and a second through terminal; and a signal attenuating unit connected to the first coupling terminal, the first through terminal, the second coupling terminal, and the second through terminal, to attenuate a signal transmitted through the first directional coupler to transmit the attenuated signal to the second directional coupler. The signal attenuating unit may include: a variable resistor unit having one end connected to the first directional coupler and the second directional coupler and the other end connected to a ground power source, and including a plurality of variable resistor elements of which resistance values are variable in response to a control signal; and an inductance unit including a plurality of inductors connected to the variable resistor elements in parallel, respectively, to remove parasitic capacitance components of the variable resistor element.

The variable resistor unit may include: a first variable resistor element having one end connected to the first coupling terminal and the second through terminal, and the other end connected to the ground power source, and a resistance value variable in response to the control signal; and a second variable resistor element having one end connected to the first through terminal and the second coupling terminal, and the other end connected to the ground power source, and having a resistance value variable in response to the control signal.

The first variable resistor element may include a first FET of which one end is connected to the first coupling terminal and the second through terminal and the other end is connected to the ground power source, and in which the control signal is applied to a gate, and the second variable resistor element may include a second FET of which one end is connected to the first through terminal and the second coupling terminal, and the other end is connected to the ground power source, and in which the control signal is applied to a gate.

The inductance unit may include: a first inductor having one end connected to the first through terminal and the second coupling terminal and the other end connected to the ground power source, to remove parasitic capacitance components generated between the one end and the other end of the first FET; and a second inductor having one end connected to the first coupling terminal and the second through terminal and the other end connected to the ground power source, to remove parasitic capacitance components generated between the one end and the other end of the second FET.

The first inductor may have a capacitance value of an intermediate value among parasitic capacitance values when a voltage of the first FET is adjusted, and an inductance value generating parallel resonance in a used frequency band, and the second inductor may have a capacitance value of an intermediate value among parasitic capacitance values when a voltage of the second FET is adjusted, and an inductance value generating parallel resonance in a used frequency band.

The first variable resistor element may include a plurality of first FETs of which one end is connected to the first coupling terminal and the second through terminal and the other end is connected to the ground power source, and in which the control signal is applied to a gate, and the second variable resistor element may include a plurality of second FETs of which one end is connected to the first through terminal and the second coupling terminal, and the other end is connected to the ground power source, and in which the control signal is applied to a gate.

The inductance unit may include: a first inductor having one end connected to the first through terminal and the second coupling terminal and the other end connected to the ground power source, to remove parasitic capacitance components generated between the one end and the other end of the first FETs; and a second inductor having one end connected to the first coupling terminal and the second through terminal and the other end connected to the ground voltage source, to remove parasitic capacitance components generated between the one end and the other end of the second FETs.

The first inductor may have a capacitance value of an intermediate value among parasitic capacitance values when voltages of the first FETs are adjusted, and an inductance value generating parallel resonance in a used frequency band, and the second inductor may have a capacitance value of an intermediate value among parasitic capacitance values when voltages of the second FETs are adjusted, and an inductance value generating parallel resonance in a used frequency band.

According to exemplary embodiments of the present invention, the low phase shift voltage variable attenuator has an advantage of minimizing a phase variation of an output signal and input/output return loss when attenuation is changed. Accordingly, it is possible to implement a voltage variable attenuator having a broadband characteristic, and implement an attenuator having various variable attenuation ranges without deterioration of phase shift performance and return loss performance by using the low phase shift voltage variable attenuator according to exemplary embodiments of the present invention.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A simple description of each drawing is provided for a more thorough understanding of the drawing cited in the detailed description of the present invention.

Figure 1A:
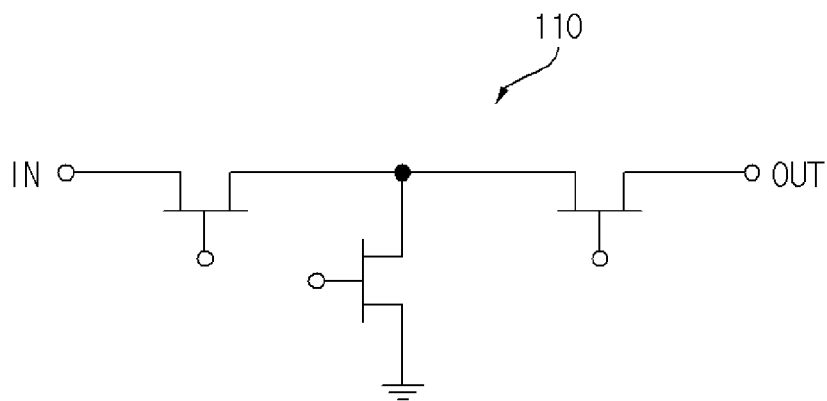
FIGS. 1A to 1C are attenuator structures in the related art.
Figure 1B:
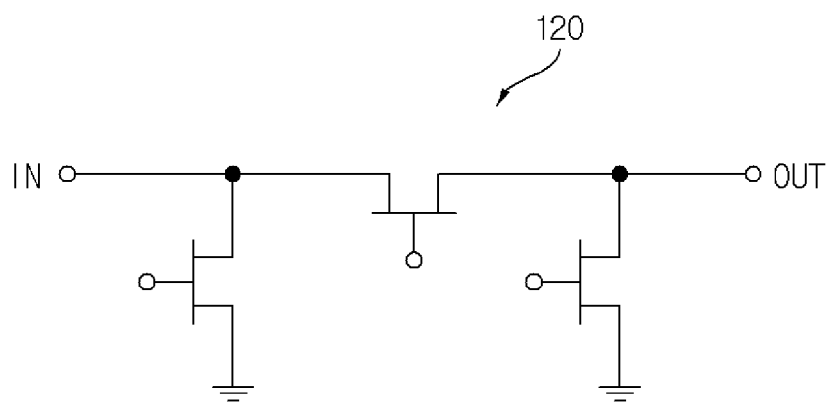
Figure 1C:
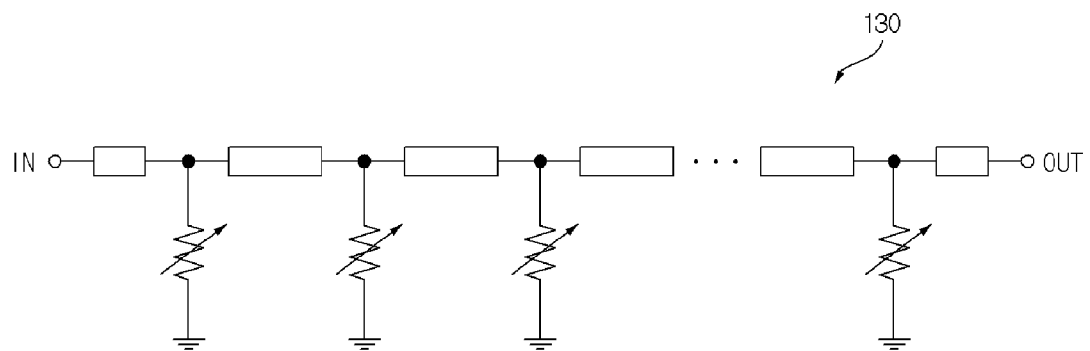

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

The present invention, an operational advantage of the present invention, and an object achieved through the implementation of the present invention will be fully understood through the reference of the accompanying drawings exemplifying an exemplary embodiment of the present invention and contents described in the drawings.

Hereinafter, the present invention will be described in detail by describing an exemplary embodiment of the present invention with reference to the accompanying drawings. Like reference numerals suggested in each drawing designate like elements.

Figure 2:
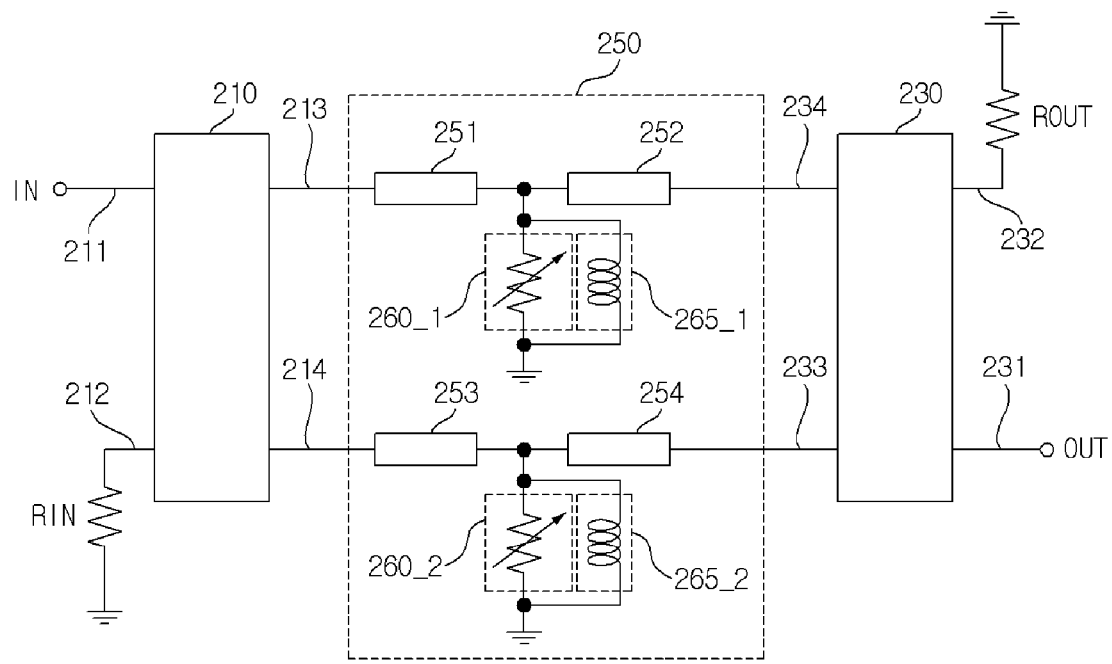
FIG. 2 is a block diagram of a low phase shift voltage variable attenuator according to an exemplary embodiment of the present invention.

FIG. 2 is a block diagram of a low phase shift voltage variable attenuator 200 according to an exemplary embodiment of the present invention.

Referring to FIG. 2, the low phase shift voltage variable attenuator 200 may include a first directional coupler 210, a second directional coupler 230, and a signal attenuating unit 250. The first directional coupler 210 may include a first input terminal 211, a first isolation terminal 212, a first coupling terminal 213, and a first through terminal 214. The first input terminal 211 is a terminal in which an input signal IN is input, and the first isolation terminal 212 is a terminal connected with a ground power source through a termination resistor RIN. The first coupling terminal 213 is a terminal connected with a second through terminal 234 of the second directional coupler 230 and the signal attenuating unit 250 to be described below, and the first through terminal 214 is a terminal connected with a second coupling terminal 233 of the second directional coupler 230 and the signal attenuating unit 250 to be described below.

The second directional coupler 230 may include a second input terminal 231, a second isolation terminal 232, a second coupling terminal 233, and a second through terminal 234. The second input terminal 231 is a terminal from which an attenuated signal OUT, which is the attenuated input input signal IN, is output, and the second isolation terminal 232 is a terminal connected with a ground power source through a termination resistor ROUT. The second coupling terminal 233 is a terminal connected with the first through terminal 214 of the first directional coupler 210 and the signal attenuating unit 250 as described above, and the second through terminal 234 is a terminal connected with the first coupling terminal 213 of the first directional coupler 210 and the signal attenuating unit 250 as described above.

The first directional coupler 210 and the second directional coupler 230 may be a 90° hybrid coupler.

The signal attenuating unit 250 may be connected between the first directional coupler 210 and the second directional coupler 230, and may attenuate a signal transmitted through the first directional coupler 210 to transmit the attenuated signal to the second directional coupler 230. That is, the signal attenuating unit 250 may be connected to the first coupling terminal, the first through terminal, the second coupling terminal, and the second through terminal. The signal attenuating unit 250 may include variable resistor units 260_1 and 260_2, and inductance units 265_1 and 265_2.

The variable resistor unit may include a plurality of variable resistor elements 260_1 and 260_2, and the inductance unit may include a plurality of inductors 265_1 and 265_2. One end of each of the variable resistor elements 260_1 and 260_2 is connected to the first directional coupler 210 and the second directional coupler 230, and the other end thereof is connected to the ground power source, and a resistance value is variable in response to a control signal. That is, one end of the variable resistor element 260_1 is connected to transmission lines 251 and 252 connecting the first coupling terminal 213 and the second through terminal 234, and the other end thereof is connected to the ground power source, and the resistance value is variable in response to the control signal. One end of the variable resistor element 260_2 is connected to the transmission lines 253 and 254 connecting the first through terminal 214 and the second coupling terminal 233, and the other end thereof is connected to the ground power source, and the resistance value is variable in response to the control signal. The inductors 265_1 and 265_2 are connected to the variable resistor elements 260_1 and 260_2 in parallel, respectively, so that it is possible to remove parasitic capacitance components of the connected variable resistor element. More particular exemplary embodiments will be described in more detail with reference to FIGS. 4 and 5.

Figure 3:
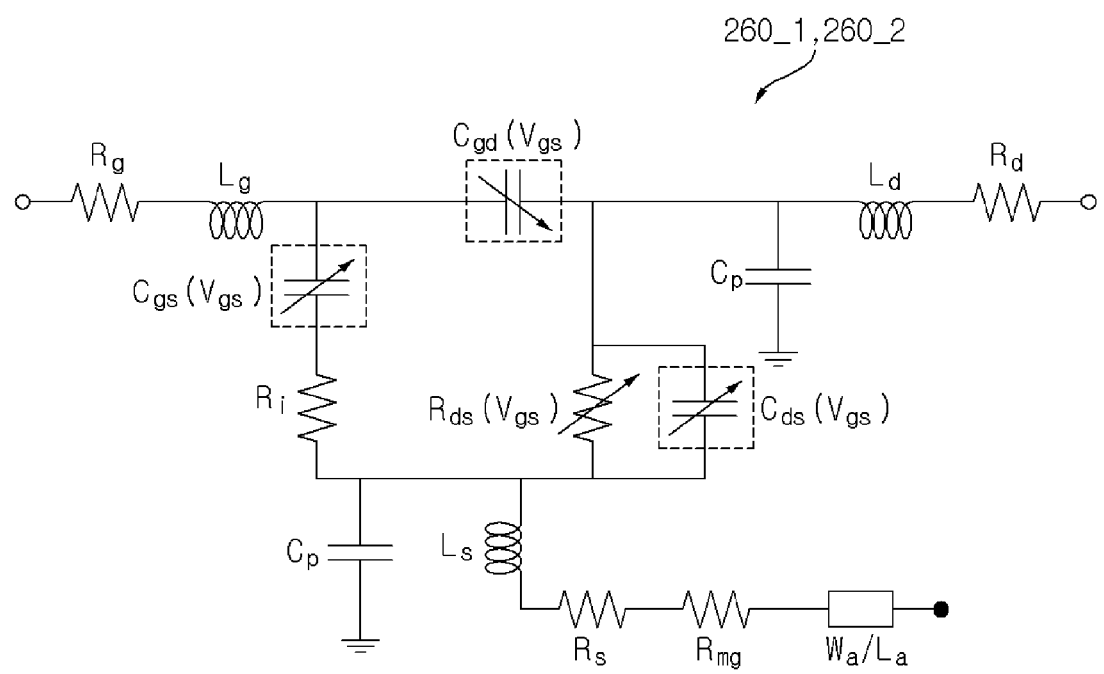
FIG. 3 is an equivalent circuit of a field effect transistor (FET) included in a variable resistor element of FIG. 2.

FIG. 3 is an equivalent circuit of a field effect transistor (FET) included in the variable resistor element of FIG. 2.

Referring to FIGS. 2 and 3, when the variable resistor elements 260_1 and 260_2 include a FET, parasitic capacitance values, such as Cgs, Cgd, and Cds, are changed according to an adjustment voltage of the FET element, and a transmission phase of the low phase shift voltage variable attenuator 200 is varied according to a change in the parasitic capacitance. Accordingly, in the present invention, in order to remove influence of the parasitic capacitance changed according to variation of the adjustment voltage for adjusting the resistance value, the inductors 265_1 or 265_2 is connected to the variable resistor elements 260_1 or 260_2 in parallel to be parallel-resonant in a used frequency band, thereby minimizing influence exerted on the transmission phase. In the present invention, the first directional coupler 210 and the second directional coupler 230 are connected to both ends of the signal attenuating unit 250, so that a change in input/output return loss is minimized in spite of an impedance change generated by the change in the resistance values of the variable resistor elements 260_1 and 260_2 and the change in the parasitic capacitance when the attenuation value of the low phase shift voltage variable attenuator 200 is changed.

Figure 4:
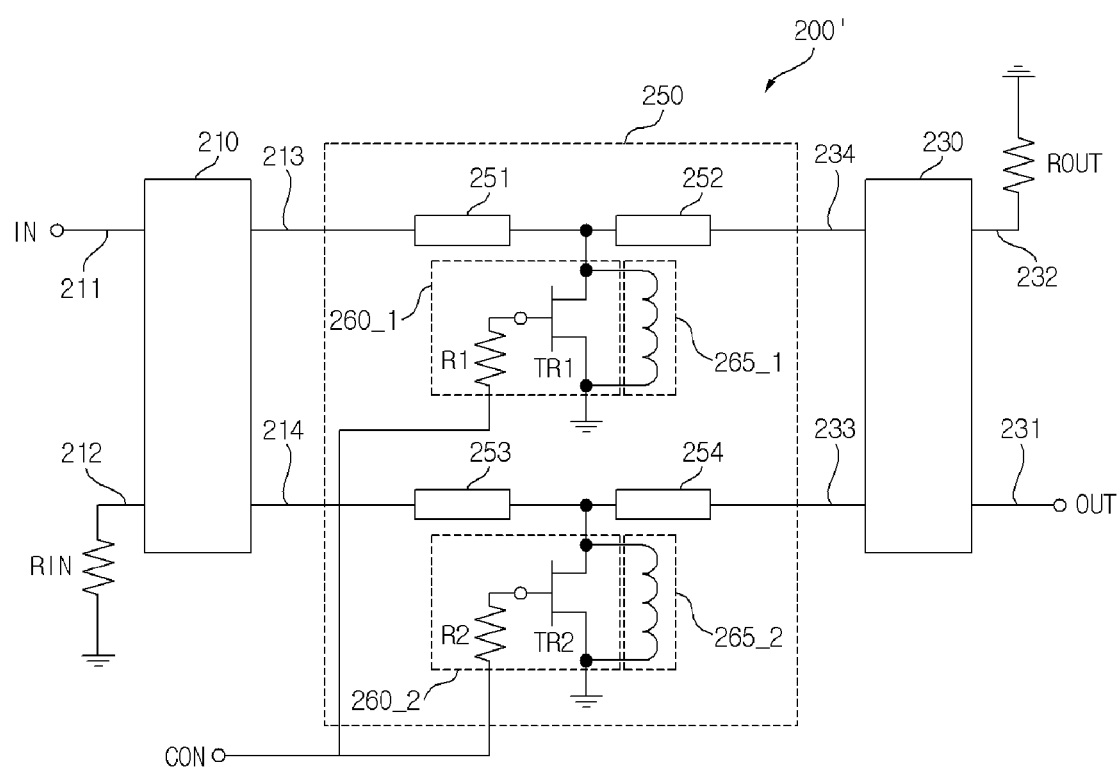
FIG. 4 is a circuit diagram illustrating a low phase shift voltage variable attenuator according to another exemplary embodiment of the low phase shift voltage variable attenuator of FIG. 2.

FIG. 4 is a circuit diagram illustrating a low phase shift voltage variable attenuator 200' according to another exemplary embodiment of the low phase shift voltage variable attenuator 200 of FIG. 2. Hereinafter, exemplary embodiments of the signal attenuating unit 250 will be described in detail with reference to FIGS. 2 to 4, and descriptions of the first directional coupler 210 and the second directional coupler 220 will be substituted with the description related to FIG. 2.

The variable resistor units 260_1 and 260_2 of the signal attenuating unit 250 may include the first variable resistor element 260_1 and the second variable resistor element 260_2. One end of the first variable resistor element 260_1 is connected to the transmission lines 251 and 252 connecting the first coupling terminal 213 and the second through terminal 234, and the other end thereof is connected to the ground power source, and the first variable resistor element 260_1 may include a first FET TR1 in which a control signal CON is applied to a gate. One end of the second variable resistor element 260_2 is connected to the transmission lines 253 and 254 connecting the first through terminal 214 and the second coupling terminal 233, and the other end thereof is connected to the ground power source, and the second variable resistor element 260_2 may include a second FET TR2 in which the control signal CON is applied to a gate. However, the first variable resistor element 260_1 and the second variable resistor element 260_2 of the present invention are not limited to a case of the FET, and may be other elements of which resistance values are variable in response to the control signal CON. FIG. 4 illustrates a case where the same control signal CON is applied to the first FET TR1 and the second FET TR2, but the present invention is not limited to the case, and a different control signal may be applied according to necessity.

The inductance unit 265_1 and 265_2 may include a first inductor 265_1 connected with one end and the other end of the first variable resistor element 260_1 in parallel, and a second inductor 265_2 connected with one end and the other end of the second variable resistor element 260_2 in parallel. That is, one end of the first inductor 265_1 is connected to the transmission lines 251 and 252 connecting the first coupling terminal 213 and the second through terminal 234, and the other end thereof is connected to the ground power source, thereby removing the parasitic capacitance components generated between one end and the other end of the first FET TR1. The first inductor 265_1 may have an intermediate capacitance value among the parasitic capacitance values when a voltage of the first FET TR1 of the first variable resistor element 260_1 is adjusted, and an inductance value generating parallel resonance in the used frequency band.

One end of the second inductor 265_2 is connected to the transmission lines 253 and 254 connecting the first through terminal 214 and the second coupling terminal 233, and the other end thereof is connected to the ground power source, thereby removing the parasitic capacitance components generated between one end and the other end of the second FET TR2. The second inductor 265_2 may have an intermediate capacitance value among the parasitic capacitance values when a voltage of the second FET TR2 of the second variable resistor element 260_2 is adjusted, and an inductance value generating parallel resonance in the used frequency band.

The variable resistor units 260_1 and 260_2 may further include a first resistor R1 having one end connected to a gate of the first FET TR1 and the other end through which the control signal CON is applied, and a second resistor R2 having one end connected to a gate of the second FET TR2 and the other end through which the control signal CON is applied.

Figure 5:
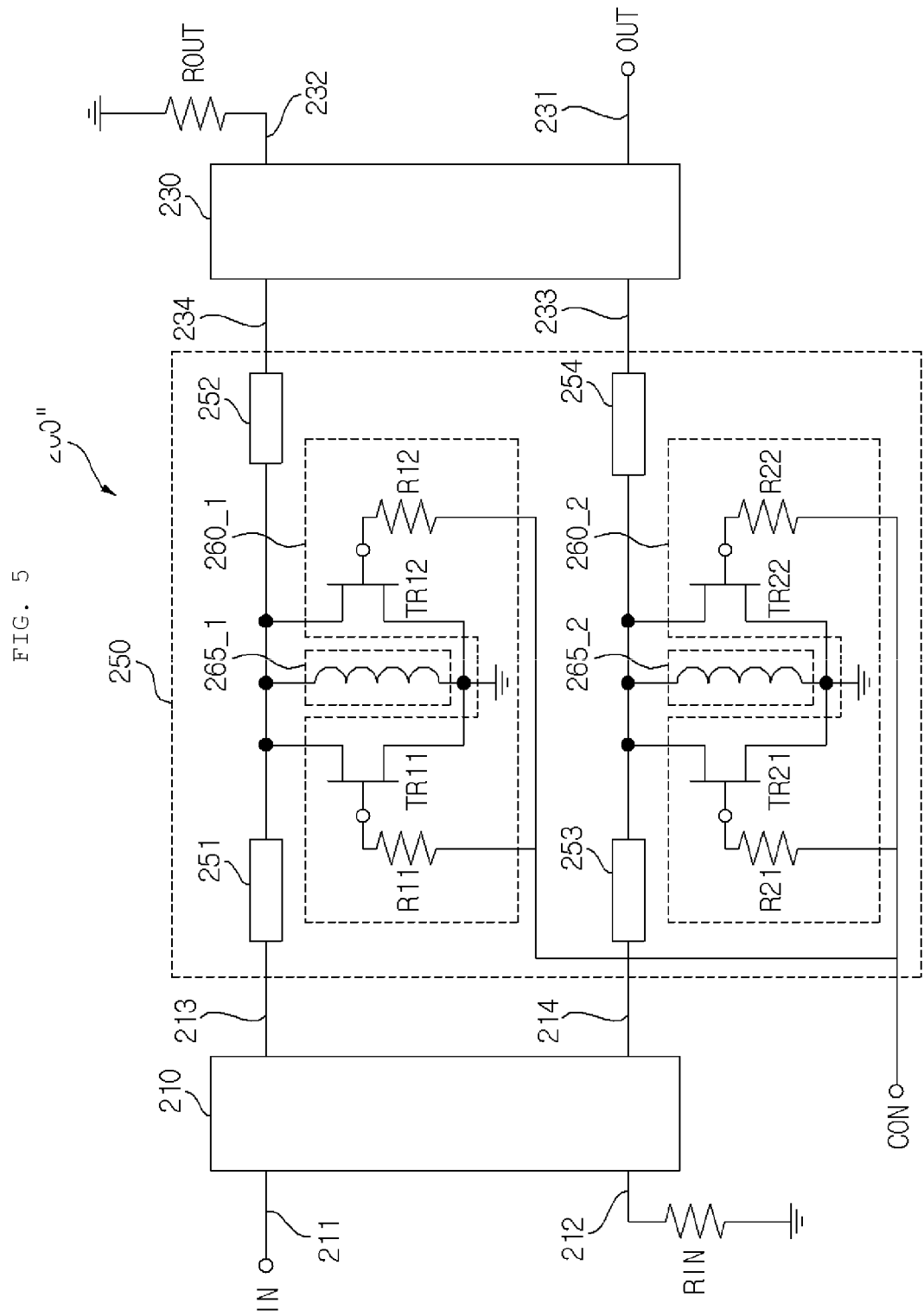
FIG. 5 is a circuit diagram illustrating a low phase shift voltage variable attenuator according to another exemplary embodiment of the low phase shift voltage variable attenuator of FIG. 2.

FIG. 5 is a circuit diagram illustrating a low phase shift voltage variable attenuator 200" according to another exemplary embodiment of the low phase shift voltage variable attenuator 200 of FIG. 2. Hereinafter, exemplary embodiments of the signal attenuating unit 250 will be described in detail with reference to FIGS. 2 to 5, and descriptions of the first directional coupler 210 and the second directional coupler 220 will be substituted with the description related to FIG. 2.

The variable resistor units 260_1 and 260_2 of the signal attenuating unit 250 may include the first variable resistor element 260_1 and the second variable resistor element 260_2. One end of the first variable resistor element 260_1 is connected to the transmission lines 251 and 252 connecting the first coupling terminal 213 and the second through terminal 234, and the other end thereof is connected to the ground power source, and the first variable resistor element 260_1 may include first FETs TR11 and TR12 in which the control signal CON is applied to the gate. One end of the second variable resistor element 260_2 is connected to the transmission lines 253 and 254 connecting the first through terminal 214 and the second coupling terminal 233, and the other end thereof is connected to the ground power source, and the second variable resistor element 260_2 may include second FETs TR21 and TR22 in which the control signal CON is applied to the gate. However, the first variable resistor element 260_1 and the second variable resistor element 260_2 of the present invention are not limited to a case of the FET, and may be other elements of which resistance values are variable in response to the control signal CON. FIG. 5 illustrates a case where the same control signal CON is applied to the first FETs TR11 and TR12 and the second FETs TR21 and TR22, but the present invention is not limited to the case, and a different control signal may be applied according to necessity.

The inductance unit 265_1 and 265_2 may include a first inductor 265_1 connected with one end and the other end of the first variable resistor element 260_1 in parallel, and a second inductor 265_2 connected with one end and the other end of the second variable resistor element 260_2 in parallel. That is, one end of the first inductor 265_1 is connected to the transmission lines 251 and 252 connecting the first coupling terminal 213 and the second through terminal 234, and the other end thereof is connected to the ground power source, thereby removing the parasitic capacitance components generated between one end and the other end of the first FETs TR11 and TR12. The first inductor 265_1 may have an intermediate capacitance value among the parasitic capacitance values when voltages of the first FETs TR11 and TR12 of the first variable resistor element 260_1 are adjusted, and an inductance value generating parallel resonance in the used frequency band.

One end of the second inductor 265_2 is connected to the transmission lines 253 and 254 connecting the first through terminal 214 and the second coupling terminal 233, and the other end thereof is connected to the ground power source, thereby removing the parasitic capacitance components generated between one end and the other end of the second FETs TR21 and TR22. The second inductor 265_2 may have an intermediate capacitance value among the parasitic capacitance values when voltages of the second FETs TR21 and TR22 of the second variable resistor element 260_2 are adjusted, and an inductance value generating parallel resonance in the used frequency band.

The variable resistor units 260_1 and 260_2 may further include a plurality of first resistors R11 or R12 having one end connected to a gate of the corresponding first FET between the first FETs TR11 and TR12 and the other end through which the control signal CON is applied, and a plurality of second resistors R21 or R22 having one end connected to a gate of the corresponding second FET between the second FETs TR21 and TR22 and the other end through which the control signal CON is applied.

Figure 6A:
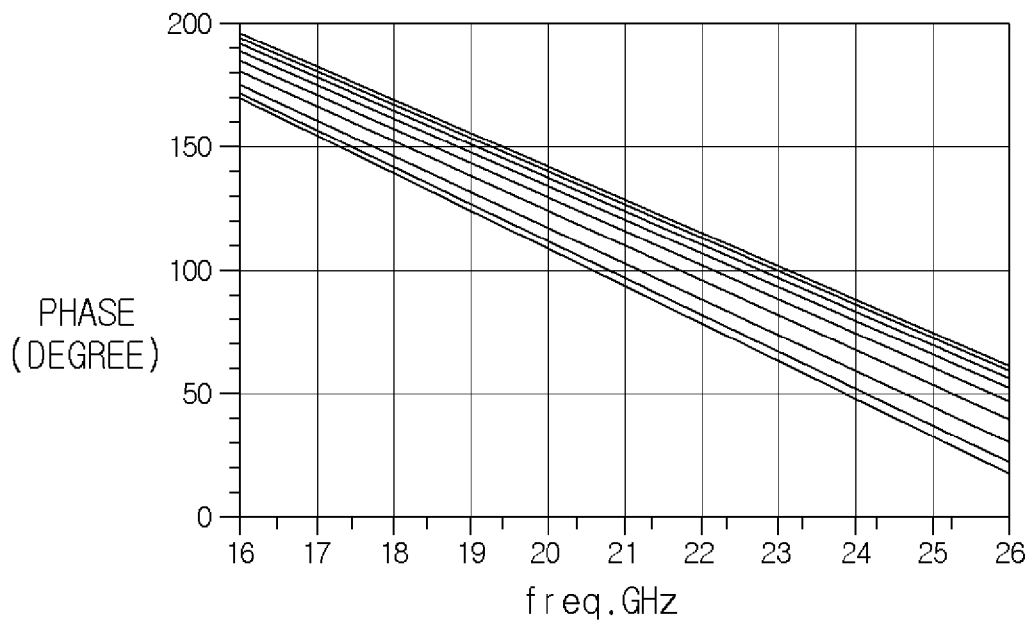
FIG. 6A is a graph illustrating a phase variation when an attenuation operation of the attenuator in the related art is performed.
Figure 6B:
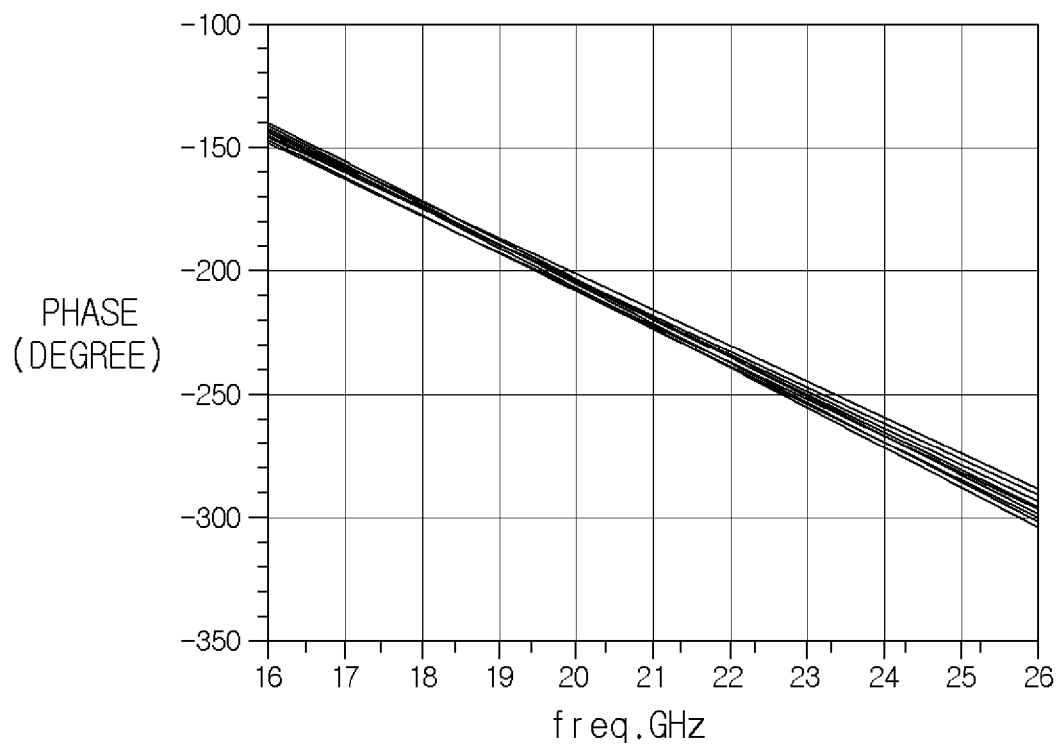
FIG. 6B is a graph illustrating a phase variation when attenuation operations of the low phase shift voltage variable attenuators according to the exemplary embodiments of the present invention of FIGS. 2 to 5 are performed.
Figure 7:
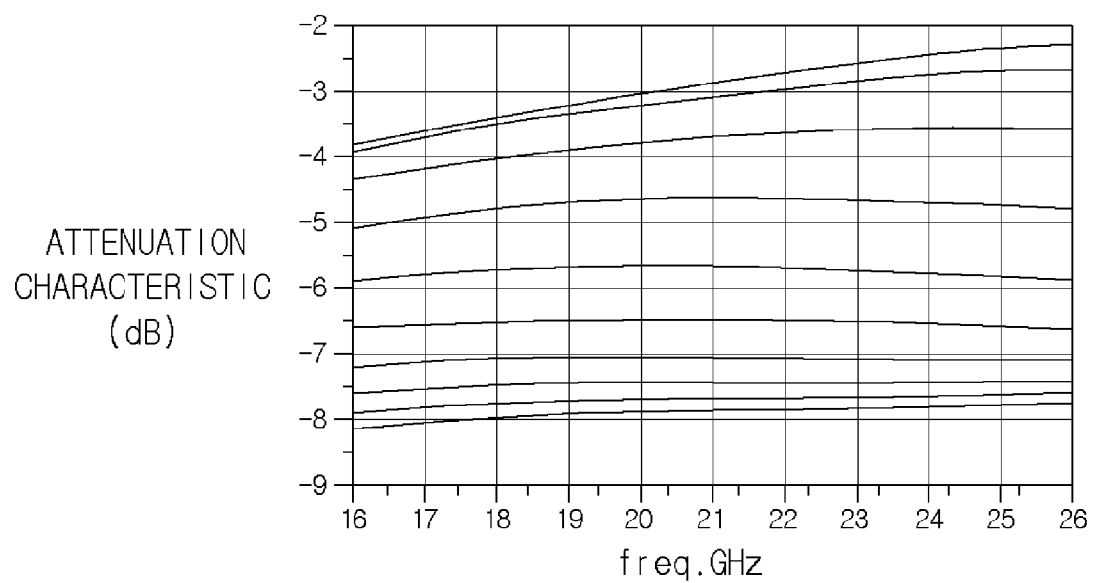
FIG. 7 is a graph illustrating attenuation characteristics of the low phase shift voltage variable attenuators according to the exemplary embodiments of the present invention of FIGS. 2 to 5.

FIG. 6A is a graph illustrating a phase variation when an attenuation operation of the attenuator in the related art is performed, and FIG. 6B is a graph illustrating a phase variation when attenuation operations of the low phase shift voltage variable attenuators according to the exemplary embodiments of the present invention of FIGS. 2 to 5 are performed. FIG. 7 is a graph illustrating attenuation characteristics of the low phase shift voltage variable attenuators according to the exemplary embodiments of the present invention of FIGS. 2 to 5, and FIG. 8 is a graph illustrating input/output return loss of the low phase shift voltage variable attenuators according to the exemplary embodiments of the present invention of FIGS. 2 to 5.

Figure 8:
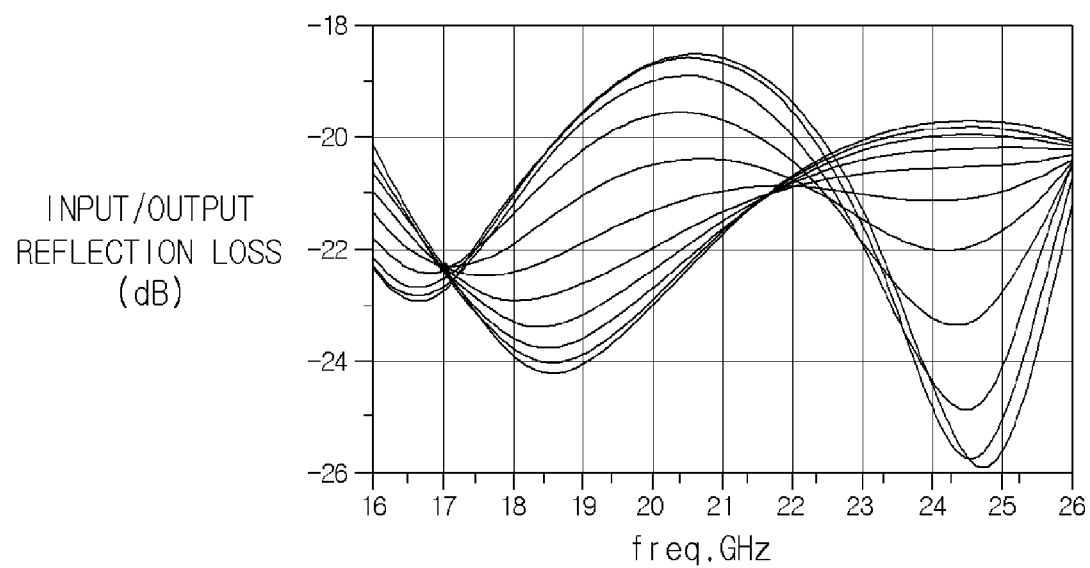
FIG. 8 is a graph illustrating input/output return loss of the low phase shift voltage variable attenuators according to the exemplary embodiments of the present invention of FIGS. 2 to 5.

Referring to FIGS. 6A and 6B, it can be seen that the attenuator in the related art has a very large phase variation during the attenuation operation of the attenuator compared to the attenuator of the present invention. For example, it can be seen that in a case where a frequency is 21 GHz, when the adjustment voltage is varied, a phase variation of approximately 35 degrees or higher is generated in the attenuator of the related art of FIG. 6A, but a phase variation within approximately 10 degrees is generated in the attenuator of the present invention of FIG. 6B. Referring to FIGS. 7 and 8, it can be seen that the low phase shift voltage variable attenuator of the present invention has an improved attenuation characteristic, and minimized input/output return loss.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A low phase shift voltage variable attenuator, comprising:
   a first directional coupler including a first input terminal in which a signal is input, a first isolation terminal connected to a ground power source through a termination resistor, a first coupling terminal, and a first through terminal;

a second directional coupler including a second input terminal through which an attenuated signal, which is the attenuated input input signal, is output, a second isolation terminal connected to a ground power source through a termination resistor, a second coupling terminal, and a second through terminal; and a signal attenuating unit connected to the first coupling terminal, the first through terminal, the second coupling terminal, and the second through terminal, and configured to attenuate a signal transmitted through the first directional coupler to transmit the attenuated signal to the second directional coupler, wherein the signal attenuating unit comprises:

a variable resistor unit having one end connected to the first directional coupler and the second directional coupler and the other end connected to a ground power source, and including a plurality of variable resistor elements of which resistance values are variable in response to a control signal; and an inductance unit including a plurality of inductors connected to the variable resistor elements in parallel, respectively, to remove parasitic capacitance components of the variable resistor element.

2. The low phase shift voltage variable attenuator of claim 1, wherein the first directional coupler and the second directional coupler are a 90° hybrid coupler.

3. The low phase shift voltage variable attenuator of claim 1, wherein the variable resistor unit comprises:

a first variable resistor element having one end connected to the first coupling terminal and the second through terminal, and the other end connected to the ground power source, and a resistance value variable in response to the control signal; and a second variable resistor element having one end connected to the first through terminal and the second coupling terminal, and the other end connected to the ground power source, and having a resistance value variable in response to the control signal.

4. The low phase shift voltage variable attenuator of claim 3, wherein the first variable resistor element includes a first FET of which one end is connected to the first coupling terminal and the second through terminal and the other end is connected to the ground power source, and in which the control signal is applied to a gate, and the second variable resistor element includes a second FET of which one end is connected to the first through terminal and the second coupling terminal, and the other end is connected to the ground power source, and in which the control signal is applied to a gate.

5. The low phase shift voltage variable attenuator of claim 4, wherein the variable resistor unit further comprises:

a first resistor having one end connected to a gate of the first FET and the other end through which the control signal is applied; and a second resistor having one end connected to a gate of the second FET and the other end through which the control signal is applied.

6. The low phase shift voltage variable attenuator of claim 4, wherein the inductance unit comprises:

a first inductor having one end connected to the first through terminal and the second coupling terminal and the other end connected to the ground power source, to remove parasitic capacitance components generated between the one end and the other end of the first FET; and a second inductor having one end connected to the first coupling terminal and the second through terminal and the other end connected to the ground power source, to remove parasitic capacitance components generated between the one end and the other end of the second FET.

7. The low phase shift voltage variable attenuator of claim 6, wherein the first inductor has an intermediate capacitance value among parasitic capacitance values when a voltage of the first FET is adjusted, and an inductance value generating parallel resonance in a used frequency band, and the second inductor has an intermediate capacitance value among parasitic capacitance values when a voltage of the second FET is adjusted, and an inductance value generating parallel resonance in a used frequency band.

8. The low phase shift voltage variable attenuator of claim 3, wherein the first variable resistor element includes a plurality of first FETs of which one end is connected to the first coupling terminal and the second through terminal and the other end is connected to the ground power source, and in which the control signal is applied to a gate, and the second variable resistor element includes a plurality of second FETs of which one end is connected to the first through terminal and the second coupling terminal, and the other end is connected to the ground power source, and in which the control signal is applied to a gate.

9. The low phase shift voltage variable attenuator of claim 8, wherein the variable resistor unit further comprises:

a plurality of first resistors having one end connected to a gate of the corresponding first FET among the first FETs and the other end through which the control signal is applied; and a plurality of second resistors having one end connected to a gate of the corresponding second FET among the second FETs and the other end through which the control signal is applied.

10. The low phase shift voltage variable attenuator of claim 8, wherein the inductance unit comprises:

a first inductor having one end connected to the first through terminal and the second coupling terminal and the other end connected to the ground power source, to remove parasitic capacitance components generated between the one end and the other end of the first FETs; and a second inductor having one end connected to the first coupling terminal and the second through terminal and the other end connected to the ground voltage source, to remove parasitic capacitance components generated between the one end and the other end of the second FETs.

11. The low phase shift voltage variable attenuator of claim 10, wherein the first inductor has an intermediate capacitance value among parasitic capacitance values when voltages of the first FETs are adjusted, and an inductance value generating parallel resonance in a used frequency band, and the second inductor has an intermediate capacitance value among parasitic capacitance values when voltages of the second FETs are adjusted, and an inductance value generating parallel resonance in a used frequency band.

* * * * *